US008633708B2

(12) United States Patent
Chang et al.

(10) Patent No.: US 8,633,708 B2
(45) Date of Patent: Jan. 21, 2014

(54) CURRENT CALIBRATION METHOD AND ASSOCIATED CIRCUIT

(71) Applicant: MStar Semiconductor, Inc., Hsinchu Hsien (TW)

(72) Inventors: Chih-Tien Chang, Hsinchu Hsien (TW); Ju-Ming Chou, Hsinchu Hsien (TW)

(73) Assignee: MStar Semiconductor, Inc. (TW)

(*) Notice: Subject to any disclaimer, the term of this patent is extended or adjusted under 35 U.S.C. 154(b) by 0 days.

(21) Appl. No.: 13/905,591

(22) Filed: May 30, 2013

(65) Prior Publication Data

US 2013/0257397 A1 Oct. 3, 2013

Related U.S. Application Data

(62) Division of application No. 12/692,035, filed on Jan. 22, 2010, now Pat. No. 8,476,909.

(30) Foreign Application Priority Data

Jan. 23, 2009 (TW) ................................ 98102963 A

(51) Int. Cl.
*G01R 35/00* (2006.01)

(52) U.S. Cl.
USPC . 324/601; 324/130; 324/750.01; 324/750.02; 324/606; 345/204; 345/178; 345/104; 345/87; 323/313

(58) Field of Classification Search
USPC .......................................................... 324/601
See application file for complete search history.

(56) References Cited

U.S. PATENT DOCUMENTS

| | | | | | |
|---|---|---|---|---|---|
| 5,184,062 | A * | 2/1993 | Ladwig | | 324/74 |
| 5,283,515 | A * | 2/1994 | Jordan | | 323/288 |
| 5,537,027 | A * | 7/1996 | Jordan | | 324/130 |
| 6,885,958 | B2 * | 4/2005 | Yaklin | | 702/107 |
| 7,126,345 | B2 * | 10/2006 | Seidel | | 324/601 |
| 2006/0061405 | A1 * | 3/2006 | Zerbe | | 327/336 |
| 2008/0175132 | A1 * | 7/2008 | Chou et al. | | 369/124.1 |
| 2009/0108858 | A1 * | 4/2009 | Kao et al. | | 324/754 |

* cited by examiner

*Primary Examiner* — Arleen M Vazquez
*Assistant Examiner* — Thang Le
(74) *Attorney, Agent, or Firm* — Han IP Corporation

(57) ABSTRACT

A current calibration method and the associated control circuit are provided. The method includes: providing a predetermined voltage to the differential output for obtaining an accurate current passing through the panel resistor during a calibration procedure and, providing a driving current to the differential output according to the accurate current during a normal operation procedure.

8 Claims, 5 Drawing Sheets

CURRENT CALIBRATION METHOD AND ASSOCIATED CIRCUIT

CROSS REFERENCE TO RELATED PATENT APPLICATION

This is a division of U.S. patent application Ser. No. 12/692,035, filed on Jan. 22, 2010, which claims the priority benefit of Taiwan Patent Application No. 098102963, filed on Jan. 23, 2009, which applications are hereby incorporated by reference in their entirety.

BACKGROUND

1. Technical Field

The present disclosure relates to a display control circuit, and more particularly to a current calibration method of a display control circuit and an associated control circuit.

2. Description of Related Art

For achieving goals of being low-voltage, low-noise and low-electromagnetic interference (EMI), nowadays a liquid crystal display (LCD) panel mostly uses a differential signal to transfer data. The differential signal interface can be a low voltage differential signaling (LVDS) interface, a mini-low voltage differential signaling (mini-LVDS) interface or a reduced swing differential signaling (RSDS) interface.

FIG. 1 illustrates a circuit diagram of a signal connection between a conventional display control circuit and an LCD panel. A display control circuit 10 can be an integrated circuit (IC) mounted on a circuit board (not shown). The display control circuit 10 comprises a digital region 150 and an analog region 100. The analog region 100 comprises a bandgap voltage reference circuit 112, an operation amplifier 114, a current mirror 116, a transistor $M_1$, an adjustable current generator 118 and an output driver 120. The digital region 150 comprises a processing circuit 152 for processing an image signal (not shown) to generate a data signal to be outputted at the output driver 120.

Generally speaking, a differential output pair of the output driver 120 can output a differential signal to an LCD panel 250. Therefore, the LCD panel 250 requires a panel resistor ($R_{panel}$) to receive the differential signal. The data from the display control circuit 10 to the LCD panel 250 is recognized according to a voltage value on the panel resistor ($R_{panel}$). For the same reason, the display control circuit 10 has N output drivers to output N differential signals to the LCD panel 250, and hence N panel resistors ($R_{panel}$) are needed on the LCD panel 250 to receive such N differential signals.

Take the LVDS interface for example. Resistance of 100 ohms is required for the panel resistor ($R_{panel}$), and a voltage swing of 350 mV is required on the panel resistor ($R_{panel}$). Accordingly, in order to have the voltage swing on the panel resistor ($R_{panel}$) reach 350 mV, the display control circuit 10 has to output a current of 3.5 mA (350 mV/100 ohm) exactly.

In general, the bandgap voltage reference circuit 112 provides a bandgap voltage ($V_{BG}$), which is stable and not varied by manufacturing process, temperature and power voltage. The bandgap voltage is inputted to a positive input end of the operation amplifier 114, and a negative input end of the operation amplifier 114 connects to a first input/output (I/O) pin 12 of the display control circuit 10. Further, the drain of the transistor ($M_1$) connects to a first end of the current mirror 116, the gate of the transistor ($M_1$) connects to an output end of the operation amplifier 114, and the source of the transistor ($M_1$) connects to the first I/O pin 12 of the display control circuit 10. The first I/O pin 12 couples to ground through an external precision resistor ($R_p$).

Obviously, during a normal operation of the operation amplifier 114, the voltage on the first I/O pin 12 of the display control circuit 10 is the bandgap voltage ($V_{BG}$). Thus, a first current (I1) on the external precision resistor ($R_p$) is ($V_{BG}/R_p$). The first current (I1) is outputted from the first end of the current mirror 116. Meanwhile, a second end of the current mirror 116 outputs a reference current ($I_{ref}$), which is proportional to the first current (I1) and can be viewed as an accurate current.

The processing circuit 152 outputs a current control signal to the adjustable current generator 118 for controlling a multiple (M) of the adjustable current generator 118, such that a current of precisely 3.5 mA is outputted from multiplying the reference current ($I_{ref}$) by the multiple (M). The output driver 120 receives the data signal output from the processing circuit 152. According to the data signal, the differential signal is driven by a 3.5 mA output from the adjustable current generator 118 to the panel resistor ($R_{panel}$) on the LCD panel 250 via a second I/O pin 14 and a third I/O pin 16.

A connection 200 through the second I/O pin 14 and the third I/O pin 16 to the panel resistor ($R_{panel}$) comprises a trace, a connector and a cable on the circuit board, and a connector on the LCD panel 250.

To obtain the accurate current, the conventional display control circuit 10 requires the first I/O pin 12 coupling to the external precision resistor ($R_p$) on the circuit board.

SUMMARY

An objective of the disclosure is to provide a calibrating display control circuit and an associated current calibration method, such that the display control circuit can generate an accurate current, and the display control circuit needs not to deploy a precision resistor on a circuit board.

The present disclosure provides a current calibration method. The method comprises: providing a predetermined voltage to a differential output to obtain an accurate current passing through a precision resistor during a calibration procedure; and providing a driving current to the differential output according to the accurate current during a normal operation procedure.

The present disclosure also provides a control circuit capable of calibrating a current. The control circuit comprises: an adjustable current generator, for converting a reference current into a driving current according to a current control signal; an output driver, with a differential output connected to an external precision resistor, for receiving the driving current and generating a differential signal at the differential output utilizing the driving current according to a data signal; a comparison apparatus, coupled to the output driver, for generating a comparison output signal according to a reference voltage and the differential signal; and a processing circuit, for controlling the current control signal according to the comparison output signal to calibrate the driving current.

The present disclosure further provides a current calibration method. The method comprises: providing a reference voltage; generating a driving current according to a reference current and a current control signal; generating a differential signal to an external precision resistor utilizing the driving current according to a data signal; generating a comparison output according to the reference voltage and the differential signal; and controlling the current control signal to calibrate magnitude of the driving current according to the comparison output.

BRIEF DESCRIPTION OF THE DRAWINGS

The present disclosure will become more readily apparent to those ordinarily skilled in the art after reviewing the following detailed description and accompanying drawings, in which.

DETAILED DESCRIPTION OF DISCLOSED EMBODIMENTS

For example, according to the regulation of LVDS specifications, a panel resistor $R_{panel}$ is 100 ohms, with a tolerance range of ±1% to ±5%. The present disclosure achieves calibrating a current in a display control circuit 300 by the panel resistor ($R_{panel}$) so that the display control circuit 300 can generate an accurate current.

Figure 1:
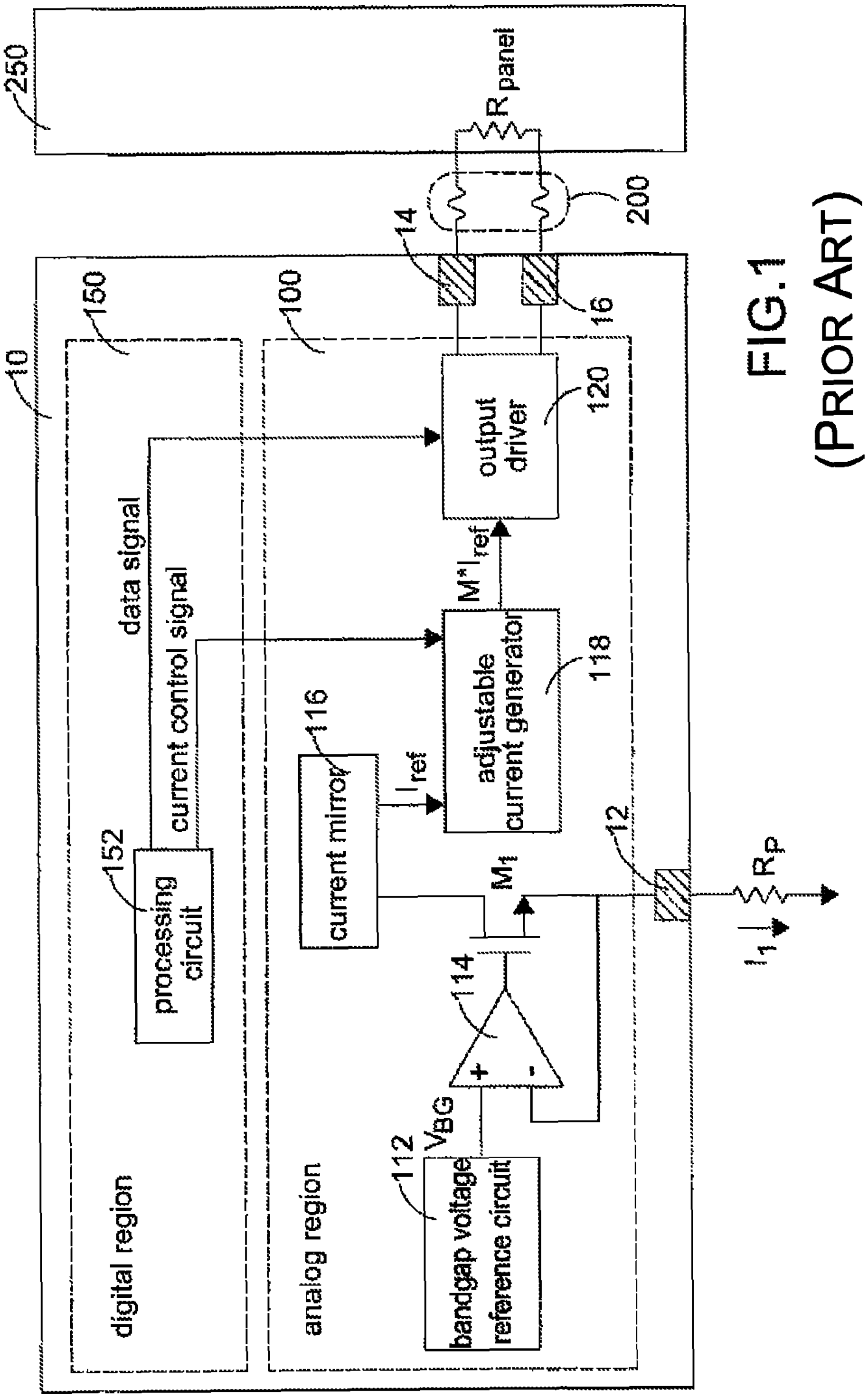
FIG.1 (PRIOR ART)
FIG. 1 illustrates a schematic diagram of a signal connection between a conventional display control circuit and a liquid crystal display (LCD) panel.
Figure 2:
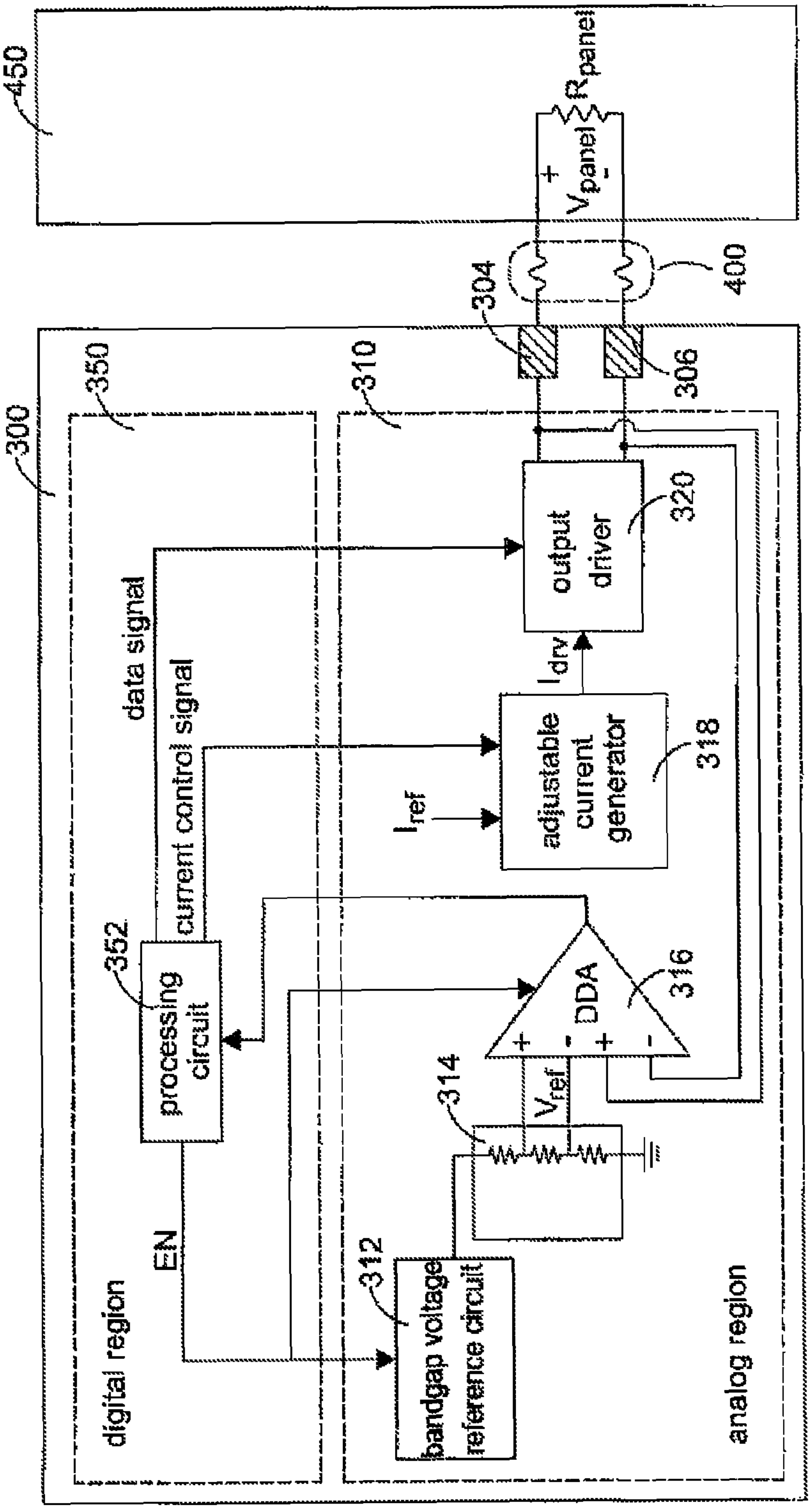
FIG. 2 illustrates a schematic diagram of a signal connection between a display control circuit according to one preferred embodiment of the present disclosure and an LCD panel.

FIG. 2 shows a schematic diagram of a signal connection of the display control circuit 300 and an LCD panel 450 according to one preferred embodiment of the present disclosure. The display control circuit 300, which can be an IC mounted on a circuit board (not shown), comprises a digital region 350 and an analog region 310. The analog region 310 comprises a bandgap voltage reference circuit 312, a voltage divider 314, a differential difference amplifier (DDA) 316, an adjustable current generator 318 and an output driver 320. The digital region 350 comprises a processing circuit 352 for processing an image signal (not shown) to generate a data signal to be outputted at the output driver 320.

The output driver 320 outputs a differential signal to the LCD panel. The LCD panel 450 with a panel resistor ($R_{panel}$) receives this differential signal. When the display control circuit 300 has N output drivers outputting N differential signals to the LCD panel 450, N panel resistors ($R_{panel}$) are deployed on the LCD panel 450 to receive such N differential signals. The following descriptions take one output driver as an example.

Referring to FIG. 2, a bandgap voltage ($V_{BG}$) from the bandgap voltage reference circuit 312 is outputted to a voltage divider 314 to generate a reference voltage ($V_{ref}$). Since a ratio between the bandgap voltage ($V_{BG}$) and the reference voltage ($V_{ref}$) is determined by the voltage divider 314, the bandgap voltage ($V_{BG}$) and the reference voltage ($V_{ref}$) both can be viewed as accurate voltages. A first input pair of the DDA 316 receives the reference voltage ($V_{ref}$), a second input pair of the DDA 316 is connected to a differential output pair of the output driver 320, and an output end of the DDA 316 is connected to the processing circuit 352. The bandgap voltage reference circuit 312 and the DDA 316 are both controlled by an enable signal (EN) of the processing circuit 352.

The processing circuit 352 can output a current control signal to the adjustable current generator 318 for controlling a multiple (M) of the adjustable current generator 318, such that the adjustable current generator 318 generates a driving current ($I_{drv}$) to the output driver 320 according to a reference current ($I_{ref}$). In this embodiment, the reference current ($I_{ref}$) can be generated by any current sources, and actual magnitude of the reference current ($I_{ref}$) cannot be acquired; and, $I_{drv}=M*I_{ref}$. For example, the adjustable current generator 318 comprises a plurality of current mirrors (not shown) to generate a mirroring current with each current mirror. The relationship between the mirroring current and the reference current can be determined by an aspect ratio of a plurality of transistors of the current mirrors. The output driver 320 receives the data signal outputted from the processing circuit 352. The differential signal is driven on a first input/output (I/O) pin 304 and a second I/O pin 306 to the panel resistor ($R_{panel}$) on the LCD panel 450 utilizing the driving current ($I_{drv}$) according to the data signal.

In this embodiment, before entering to a normal operation procedure, the display control circuit 300 performs a calibration procedure to determine the magnitude of the reference current ($I_{ref}$) in the display control circuit 300. During the calibration procedure, the processing circuit 352 asserts the enable signal (EN) to enable the bandgap voltage reference circuit 312 and the DDA 316, such that the bandgap voltage reference circuit 312 outputs the bandgap voltage ($V_{BG}$). The reference voltage ($V_{ref}$) generated by the bandgap voltage ($V_{BG}$) through the voltage divider 314 is inputted to a first input pair of the DDA 316.

Then, the processing circuit 352 modifies the current multiple (M) of the adjustable current generator 318 using the current control signal and provides the modified driving current ($I_{drv}$) to the panel resistor ($R_{panel}$) via the output driver 320 to correspondingly vary a first voltage ($V_{panel}$) on the panel resistor ($R_{panel}$).

Since the first voltage ($V_{panel}$)) is inputted into the second input pair of the DDA 316, the DDA 316 compares the reference voltage ($V_{ref}$) with the first voltage ($V_{panel}$) to output a comparison result to the processing circuit 352 through the output end of the DDA 316.

Supposing when a multiple (M) of the adjustable current generator 318 reaches a first multiple ($M_1$), the reference voltage ($V_{ref}$) is substantially the same as the first voltage ($V_{panel}$). For example, through varying the multiple (M) in sequence, the DDA 316 makes a transition from high to low. When the first voltage ($V_{panel}$) is close to the reference voltage ($V_{ref}$), the first multiple ($M_1$) is determined. Alternatively, all admissible values of the multiple (M) are applied to the adjustable current generator 318. All comparison output results of the DDA 316 are recorded in a register (not shown), and then an optimum is selected by the processing circuit 352. Consequently, the processing circuit 352 can assure that the voltage on the differential output pair is the reference voltage ($V_{ref}$) according to the variance of the output end of the DDA 316. Therefore, the driving current ($I_{drv}$) is ($V_{ref}/R_{panel}$). With the first multiple ($M_1$), it is concluded that the reference current ($I_{ref}=I_{drv}/M_1$). Since the reference voltage ($V_{ref}$) can be viewed as an accurate voltage, the driving current ($I_{drv}$) and the reference current ($I_{ref}$) can both be determined. Hence the driving current ($I_{drv}$) and the reference current ($I_{ref}$) are accurate. Accordingly, the calibration procedure of the display control circuit 300 is completed.

During the normal operation procedure, the enable signal (EN) is de-asserted to disable the bandgap voltage reference circuit 312 and the DDA 316. At this point, the processing circuit 352 determines the capability of the reference current ($I_{ref}$). Thus, the processing circuit 352 may control the multiple of the adjustable current generator 318 to a second multiple ($M_2$) through current control signal, such that the driving current ($I_{drv}$) of 3.5 mA can be obtained. The output driver 320 receives the data signal outputted from the processing circuit 352. Using the driving current ($I_{drv}$) of 3.5 mA output from the adjustable current generator, the differential signal is outputted according to the data signal and then driven to the panel resistor ($R_{panel}$) on the LCD panel 450 via the first I/O pin 304 and the second I/O pin 306. For example, a connection 400 through the first I/O pin 304 and the second I/O pin 306 to the panel resistor ($R_{panel}$), comprises a trace on a circuit board, a connector on the circuit board, a cable, and a connector on the LCD panel 450.

In the above embodiment, the accurate current can be calibrated by the panel resistor on the LCD panel, such that the display control circuit 300 can produce the accurate current using the panel resistor during the calibration procedure. During the normal operation procedure, the differential signal is driven by the accurate current to the panel resistor. So, an external precision resistor need not be deployed on the circuit board. While the disclosure has been described in terms of what is presently considered to be the most practical and preferred embodiments, it is to be understood that the disclosure needs not to be limited to the above embodiments. For example, the above embodiment discloses that the DDA 316 compares the reference voltage ($V_{ref}$) with the differential signal output from the output driver 320 for generating the comparison output. However, persons skilled in the art can alter an input signal of an input end of the DDA 316 according to the above disclosure. For instance, the differential signal can be enlarged or divided and then sent to the DDA 316 for comparison. Alternatively, although the above embodiment discloses that the bandgap voltage ($V_{BG}$) generates the reference voltage ($V_{ref}$) by the voltage divider 314 as a comparison input, persons skilled in the art can instead take the bandgap voltage ($V_{BG}$) as the comparison input directly.

Figure 3:
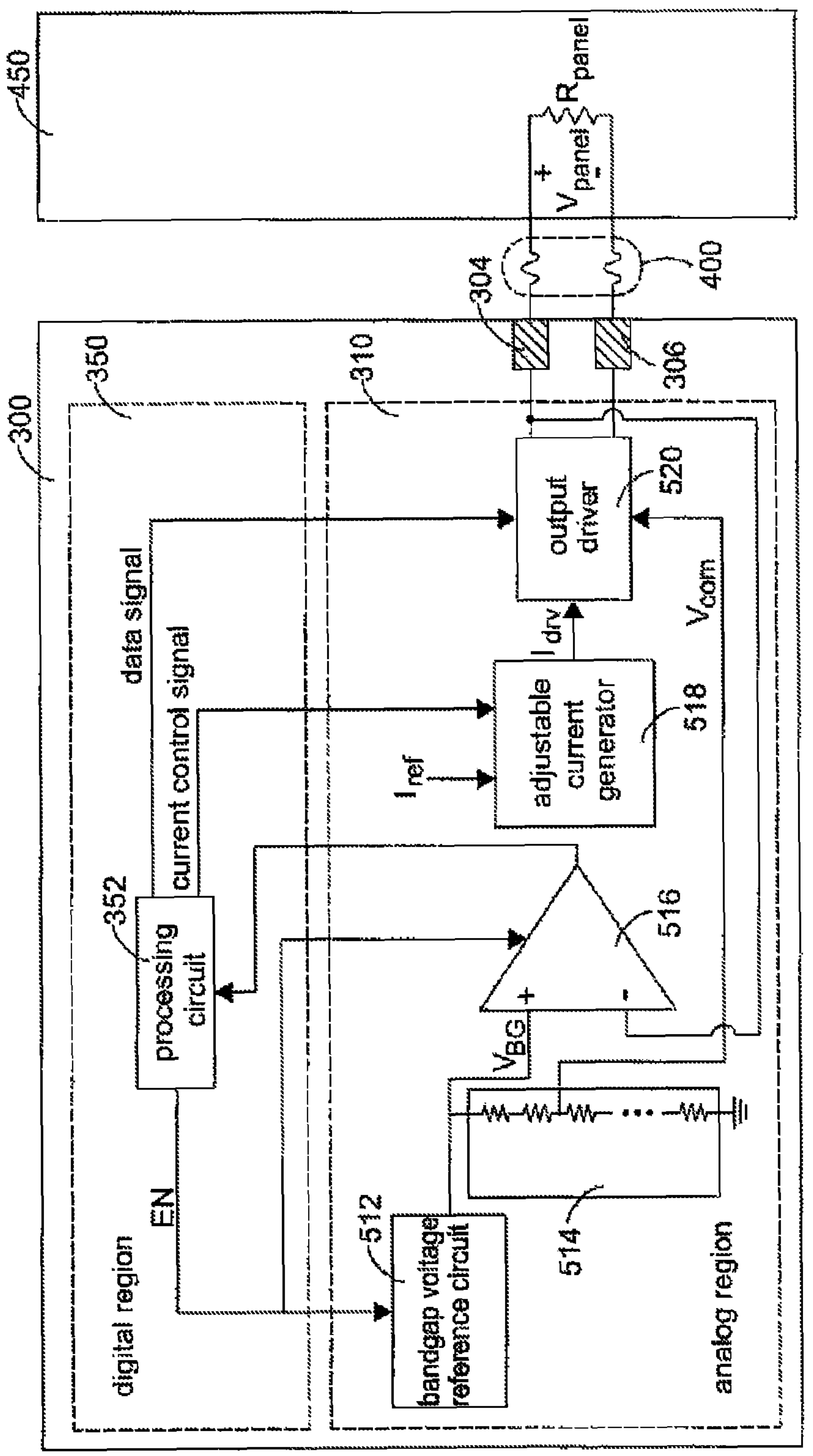
FIG. 3 illustrates a schematic diagram of a signal connection between a display control circuit according to another preferred embodiment of the present disclosure and an LCD panel.

As shown in FIG. 3, according to another preferred embodiment of the present disclosure, a schematic diagram of the signal connection between the display control circuit 300 and the LCD panel 450 is provided. The only difference from FIG. 2 is that the DDA is replaced by a comparator 516. That is to say, the comparator 516 is applied to compare a single-ended signal from the differential signal and the bandgap voltage ($V_{BG}$). Preferably, a common mode voltage ($V_{com}$) is provided to an output driver 520 as a reference of the common mode voltage ($V_{com}$) by the bandgap voltage ($V_{BG}$) via a voltage divider 514, such that the output driver 520 generates a differential signal to a panel resistor according to a driving current ($I_{drv}$) outputted from an adjustable current generator 518. The comparator 516 compares the bandgap voltage ($V_{BG}$) with the single-ended signal. The calibration procedure is the same as FIG. 2 and detailed description thereof shall be omitted here.

Figure 4:
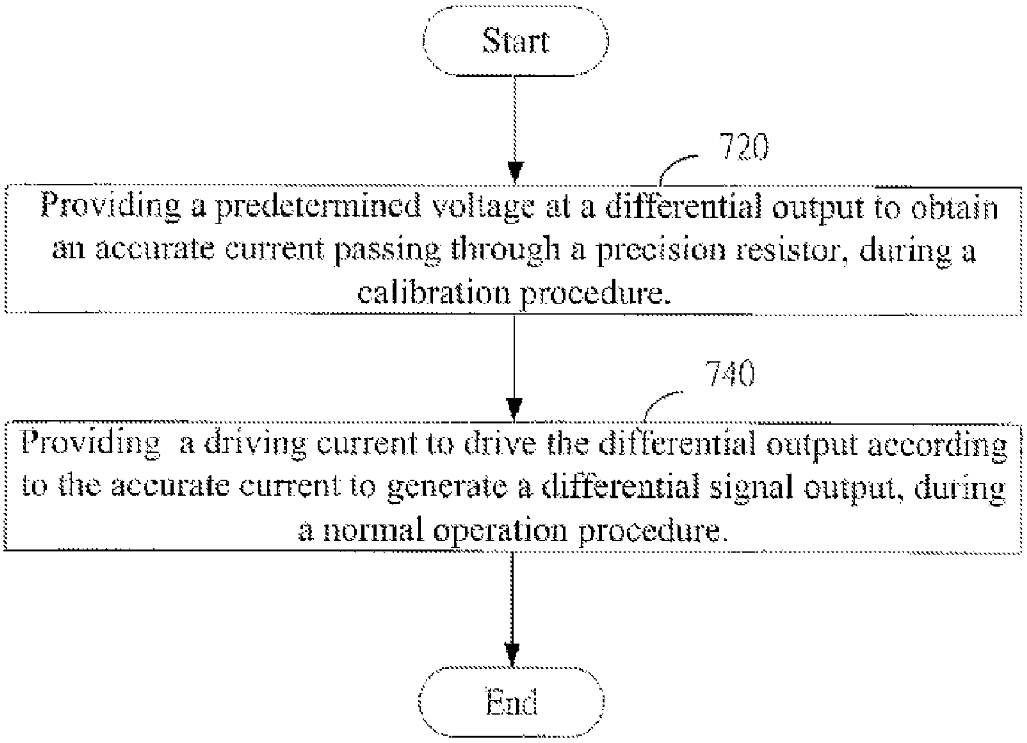
FIG. 4 illustrates a current calibration method according to one preferred embodiment of the present disclosure.

FIG. 4 illustrates a current calibration method according to a preferred embodiment of the disclosure. In Step 720, during a calibration procedure, a predetermined voltage is provided to a differential output pair to obtain an accurate current passing through a precision resistor. The precision resistor can be the panel resistor on the display panel, such as an LCD panel. In Step 740, during a normal operation procedure, a driving current is provided to drive the differential output according to the accurate current to generate a differential signal output.

Figure 5:
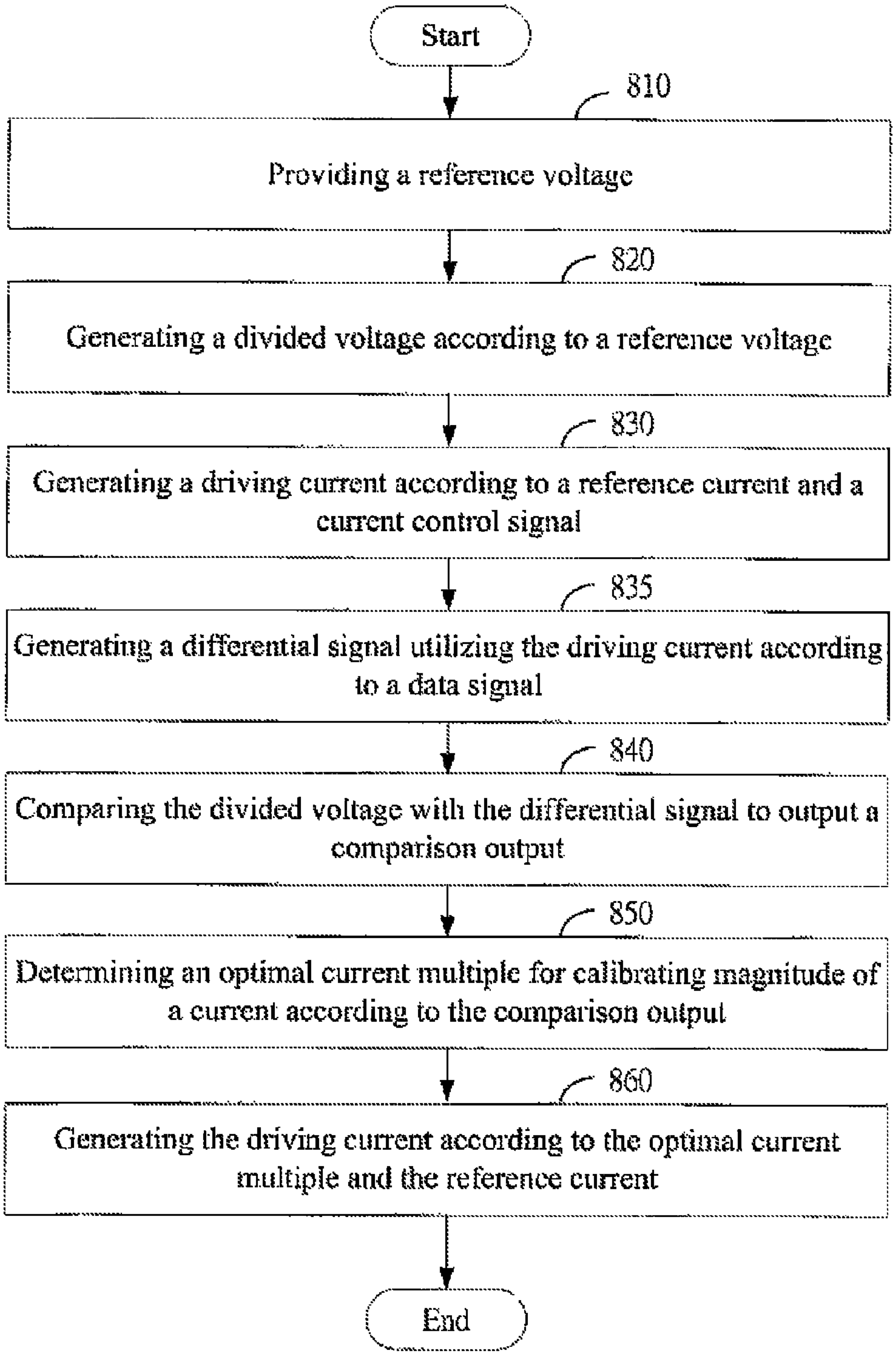
FIG. 5 illustrates a current calibration method according to one preferred embodiment of the present disclosure.

FIG. 5 illustrates a current calibration method according to another preferred embodiment of the disclosure. In Step 810, a reference voltage is provided. In Step 820, a divided voltage is generated according to a reference voltage. In Step 830, a driving current is generated to drive a differential signal on an external precision resistor according to a reference current and a current control signal. The current control signal indicates a current multiple. The precision resistor can be a panel resistor on a display panel, such as an LCD panel. For example, the relationship between the driving current and the reference current is determined by the current multiple. According to the current multiple, a plurality of current mirrors can be controlled to generate the driving current. In Step 835, a differential signal to an external precision resistor is generated by the driving current according to a data signal. For instance, the differential signal is an LVDS signal. In Step 840, the divided voltage is compared with the differential signal to output a comparison output. In Step 850, an optimal current multiple for calibrating magnitude of a current is determined according to the comparison output. For example, the optimal current multiple is determined in response to a signal transition of the comparison output. Alternatively, all comparison outputs from various current multiples are recorded in a register, and then an optimum is selected. In Step 860, the driving current is generated according to the optimal current multiple and the reference current.

To sum up, the present disclosure provides a current calibration method. The method comprises: providing a reference voltage; generating a driving current according to a reference current and a current control signal; generating a differential signal to an external precision resistor by the driving current according to a data signal, wherein the current control signal indicates a current multiple; generating a comparison output according to the reference voltage and the differential signal; controlling the current control signal for calibrating magnitude of the driving current according to the comparison output; determining an optimal current multiple according to the comparison output; and generating the driving current according to the optimal current multiple and the reference current. The reference voltage can be a bandgap voltage, or a divided voltage that is proportional to the bandgap voltage and generated by using a voltage divider according to the bandgap voltage. The step of generating the comparison output can result from comparing the reference voltage and the differential signal or comparing the reference voltage and a single-ended signal to generate a comparison output signal.

The present disclosure as well provides a control circuit capable of calibrating a current. The control circuit comprises an adjustable current generator, an output driver, a comparison apparatus and a processing circuit. The adjustable current generator converts a reference current into a driving current according to a current control signal. The output driver, with a differential output connected to an external precision resistor, receives the driving current and generates a differential signal at the differential output according to a data signal utilizing the driving current to. The comparison apparatus, coupled to the output driver, generates a comparison output signal according to a reference voltage and the differential signal. The processing circuit controls the current control signal to calibrate the driving current according to the comparison output signal. The reference voltage can be a bandgap voltage, or a voltage that is proportional to the bandgap voltage and generated utilizing a voltage divider according to the bandgap voltage. The comparison apparatus can be a DDA. The DDA, with a first input pair and a second input pair, receives the reference voltage and the differential signal, to generate the comparison output signal by comparing the reference voltage with the differential signal. Alternatively, the comparison apparatus can be a comparator, with a first input and a second input, for receiving the reference voltage and a single-ended signal of the differential signal respectively, to generate the comparison output signal by comparing the reference voltage with the single-ended signal. Preferably, according to the bandgap voltage, the voltage divider generates a common mode voltage that is provided to the output driver as a reference. The differential signal interface can be a low voltage differential signaling (LVDS) interface, a mini-low voltage differential signaling (mini-LVDS) interface or a reduced swing differential signaling (RSDS) interface. The control circuit is implemented in a display controller or a timing controller.

While various embodiments have been described in terms of what is presently considered to be the most practical and preferred embodiments, it is to be understood that other embodiments need not to be limited to the above disclosure. On the contrary, it is intended to cover various modifications and similar arrangements included within the spirit and scope of the appended claims which are to be accorded with the broadest interpretation so as to encompass all such modifications and similar structures.

What is claimed is:

1. A control circuit, capable of calibrating a current, comprising:

an adjustable current generator that converts a reference current into a driving current according to a current control signal;

an output driver, with a differential output connected to an external precision resistor, that receives the driving current and generates a differential signal at the differential output utilizing the driving current according to a data signal;

a comparison apparatus, coupled to the output driver, that generates a comparison output signal according to a reference voltage and the differential signal; and a processing circuit that controls the current control signal according to the comparison output signal to calibrate the driving current, wherein the comparison apparatus comprises a comparator having a first input that receives the reference voltage and a second input that receives a single-ended signal of the differential signal, and wherein the comparator compares the reference voltage with the single-ended signal to generate the comparison output signal.

2. The control circuit of claim 1, wherein the comparison apparatus comprises a differential difference amplifier (DDA) having a first input pair that receives the reference voltage and a second input pair that receives the differential signal, and wherein the DDA compares the reference voltage with the differential signal to generate the comparison output signal.

3. The control circuit of claim 1, wherein the current control signal indicates a current multiple.

4. The control circuit of claim 3, wherein the processing circuit controls the current control signal, such that a voltage on the differential output is approximately the reference voltage, to determine the current multiple according to the comparison output signal.

5. The control circuit of claim 1, wherein the control circuit is implemented in a display controller or a timing controller.

6. The control circuit of claim 1, further comprising:

a bandgap voltage reference circuit that generates a bandgap voltage; and a voltage divider that generates the reference voltage according to the bandgap voltage.

7. The control circuit of claim 6, wherein the reference voltage generated by the voltage divider is proportional to the bandgap voltage.

8. The control circuit of claim 6, wherein the voltage divider generates the reference voltage and a common mode voltage for the output driver according to the bandgap voltage.

* * * * *